US010707240B2

(12) United States Patent
Yamashita

(10) Patent No.: US 10,707,240 B2
(45) Date of Patent: Jul. 7, 2020

(54) DISPLAY DEVICE

(71) Applicant: Japan Display Inc., Minato-ku (JP)

(72) Inventor: Manabu Yamashita, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 7 days.

(21) Appl. No.: 16/123,046

(22) Filed: Sep. 6, 2018

(65) Prior Publication Data
US 2019/0074299 A1    Mar. 7, 2019

(30) Foreign Application Priority Data

Sep. 7, 2017 (JP) ................. 2017-171935

(51) Int. Cl.
| H01L 27/146 | (2006.01) |
|---|---|
| H01L 27/12 | (2006.01) |
| H01L 23/532 | (2006.01) |
| G02F 1/1337 | (2006.01) |
| G02F 1/1343 | (2006.01) |
| H01L 27/32 | (2006.01) |
| G02F 1/1362 | (2006.01) |
| G09G 3/36 | (2006.01) |
| G02F 1/1368 | (2006.01) |

(52) U.S. Cl.
CPC ......... *H01L 27/124* (2013.01); *G02F 1/1368* (2013.01); *G02F 1/133784* (2013.01); *G02F 1/134309* (2013.01); *G02F 1/136227* (2013.01); *G02F 1/136286* (2013.01); *G09G 3/3677* (2013.01); *H01L 23/5329* (2013.01); *H01L 27/1225* (2013.01); *H01L 27/1251* (2013.01); *H01L 27/14601* (2013.01); *H01L 27/3244* (2013.01); *G02F 2201/121* (2013.01); *G02F 2201/123* (2013.01); *H01L 27/3262* (2013.01)

(58) Field of Classification Search
CPC ..................................................... H01L 29/68
See application file for complete search history.

(56) References Cited

U.S. PATENT DOCUMENTS

| 5,940,732 A | 8/1999 | Zhang | |
|---|---|---|---|
| 2010/0159639 A1* | 6/2010 | Sakata | ............. H01L 29/41733 438/104 |
| 2011/0049508 A1 | 3/2011 | Kawamura et al. | |
| 2011/0090183 A1* | 4/2011 | Yamazaki | ............ G09G 3/3648 345/204 |

FOREIGN PATENT DOCUMENTS

| JP | 9-213968 | 8/1997 |
|---|---|---|
| JP | 2011-54812 | 3/2011 |

* cited by examiner

*Primary Examiner* — Cheung Lee
(74) *Attorney, Agent, or Firm* — Oblon, McClelland, Maier & Neustadt, L.L.P.

(57) ABSTRACT

The purpose of the invention is to countermeasure a disconnection between the drain electrode or the source electrode and the wiring or the electrode formed on the insulating film via through hole. The concrete structure is that: A display device having a display area including a plurality of pixels comprising: the pixel includes a thin film transistor having a semiconductor layer as an active element, a first insulating film is formed to cover a drain electrode of the thin film transistor, the drain electrode is connected with an electrode or an wiring that are formed on the first insulating film via a through hole, an oxide semiconductor layer exists between the drain electrode and the first insulating film, the oxide semiconductor layer does not exist at the bottom of the through hole.

19 Claims, 13 Drawing Sheets

DISPLAY DEVICE

CLAIM OF PRIORITY

The present application claims priority from Japanese Patent Application JP 2017-171935 filed on Sep. 7, 2017, the content of which is hereby incorporated by reference into this application.

BACKGROUND OF THE INVENTION

(1) Field of the Invention

The present invention relates to a display device having a TFT (Thin Film Transistor) of the poly silicon (poly-Si) or a TFT of the oxide semiconductor, wherein a reliability of connection via through hole is improved between the electrodes or between the wirings.

(2) Description of the Related Art

A liquid crystal display device has a TFT substrate, a counter substrate opposing to the TFT substrate, and a liquid crystal layer sandwiched between the TFT substrate and the counter substrate. The TFT substrate has plural pixels; each of the pixels has a pixel electrode and a thin film transistor (TFT). A transmittance of light in each of the pixels is controlled by liquid crystal molecules; thus, images are formed. On the other hand, an organic EL display device has a self-illuminant organic EL layer and a TFT in each of the pixels, thus, color images are formed. The organic EL display device does not need the back light, therefore, it is advantageous in forming a flexible display device.

In a display device, the TFTs are used for switching elements in the pixels, or used in the peripheral driving circuit. The TFT of the poly silicon is used in the peripheral driving circuit since it has high mobility. On the other hand, the TFT of the oxide semiconductor is suitable for the switching transistor since it has high OFF resistance. Another advantage of the TFT of the oxide semiconductor is that it can be made in the low temperature process compared with the TFT of the poly silicon.

The display device is formed by many layers; connections between the wirings are made via through holes formed in the insulating films. Formations of through holes are executed by photoetching; therefore, several gasses for dry etching or solutions for wet etching are used. Various materials are used for insulating layers, in which the through holes are formed; and various materials are used for the wirings that make contacts at the through holes. Thus, a reliability of the connection at the through holes tends to have problems.

The patent document 1 (Japanese patent application laid open No. Hei 9-213968) discloses to form the gate electrode by aluminum; the surface of the aluminum is transformed to the aluminum oxide by anode oxidization; thus adherence between the gate electrode and the resist is improved. The patent document 1 further discloses that when the gate electrode and the wiring is connected in the through hole, the aluminum oxide at the surface of the gate electrode in the through hole is removed by etching.

The patent document 2 (Japanese patent application laid open No. 2011-54812) discloses to form the scarifying layer on the semiconductor layer to prevent the semiconductor layer from being contaminated when the drain electrode or the source electrode are fabricated; and to remove the scarifying layer on the channel by wet etching after the drain electrode and the source electrode have been fabricated.

SUMMARY OF THE INVENTION

When the TFT of the oxide semiconductor is used, an insulating films that contain a lot of oxygens are used for the gate insulating film or the interlayer insulating film so that the oxygens in the oxide semiconductor layer are not extracted. This structure, however, tends to generate the oxide films on the surface of the metals, which are used for the electrodes or wirings. The metal oxides are generally insulating materials, thus, there occurs a danger of disconnections between the wirings or between the electrodes in the through holes for the connections.

In addition, in a display device that uses both of the TFT of the oxide semiconductor and the TFT of the poly silicon, other conditions are added for the formation of through holes. In this case, there could be a chance that when one through hole is formed, another through hole is destroyed, at the same time.

The purpose of the present invention is to raise a reliability of electrical connection in the through hole, specifically in the structure when the TFT of oxide semiconductor is used or in the structure that both of the TFT of the oxide semiconductor and the TFT of the poly silicon are used in the display device.

The present invention overcomes the above explained problem; the concrete structures are as follows.
(1) A display device having a display area including a plurality of pixels comprising: the pixel includes a thin film transistor having a semiconductor layer as an active element, a first insulating film is formed to cover a drain electrode of the thin film transistor, the drain electrode is connected with an electrode or an wiring that are formed on the first insulating film via a through hole, an oxide semiconductor layer exists between the drain electrode and the first insulating film, the oxide semiconductor layer does not exist at the bottom of the through hole.
(2) A display device having a display area and a peripheral driving circuit comprising: the peripheral driving circuit includes a plurality of thin film transistors, which include a plurality of semiconductors as active elements, a first insulating film is formed to cover a circuit wiring that connects the plurality of thin film transistors, the circuit wiring is connected with an electrode or a wiring that are formed on the first insulating film via a through hole, an oxide semiconductor layer exists between the circuit wiring and the first insulating film, the oxide semiconductor layer does not exist at the bottom of the through hole.
(3) A display device having a display area including a plurality of pixels comprising: the pixel includes a thin film transistor having a semiconductor layer as an active element, a first insulating film is formed to cover a gate electrode of the thin film transistor, the gate electrode is connected with an electrode or an wiring that are formed on the first insulating film via a through hole, an oxide semiconductor layer exists between the gate electrode and the first insulating film, the oxide semiconductor layer does not exist at the bottom of the through hole.

DETAILED DESCRIPTION OF THE PREFERRED EMBODIMENTS

The present invention will be explained in detail referring to the following embodiments. In the explanation below, the invention is mainly explained in an example of the liquid crystal display device; however, the present invention is applicable to the organic EL display device, too.

Embodiment 1

Figure 1:
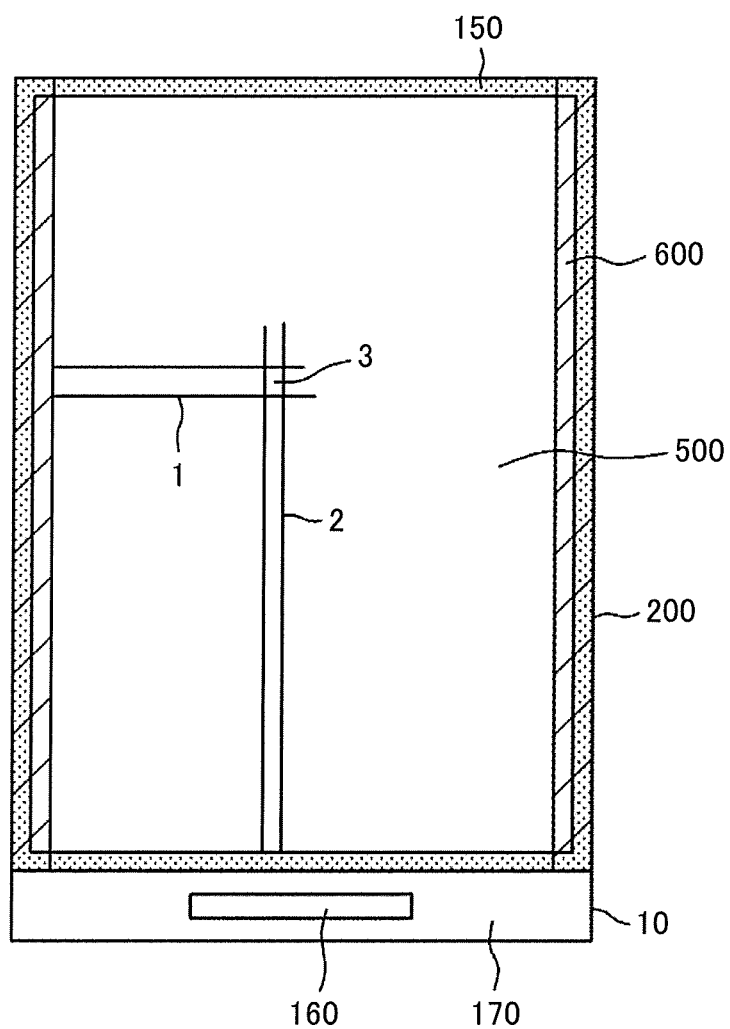
FIG. 1 is a plan view of the liquid crystal display device.
Figure 1:
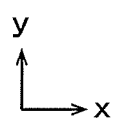

FIG. 1 is a plan view of a liquid crystal display device, which the present invention is applied. In FIG. 1, the TFT substrate 10, on which the TFTs and pixel electrodes are formed, adheres to the counter substrate 200 at the periphery by sealing material 150; the liquid crystal is encapsulated between the TFT substrate 10 and the counter substrate 200.

The display area 500 is formed in the area surrounded by the sealing material 150. A peripheral driving circuit 600 is formed on the both sides of the display area 500. A part of the peripheral driving circuit 600 is formed overlapping with sealing material 150 in a plan view.

In FIG. 1, in the display area 500, the scanning lines 1 extend from the peripheral driving circuit 600 in the lateral direction (x direction) and are arranged in the longitudinal direction (y direction). The video signal lines 2 extend in the longitudinal direction (y direction) and are arranged in the lateral direction (x direction). Video signals are sent to the video signal lines 2 from the driver IC 160, which is installed on the terminal area 170. The pixel 3 is formed in the area surrounded by the scanning lines 1 and the video signal lines 2.

In FIG. 1, the TFT substrate 10 is made bigger than the counter substrate 200; the area of the TFT substrate 10 where the counter substrate 200 does not overlap is the terminal area 170; the driver IC 160 is installed on the terminal area 170. Terminals are formed in the terminal area 170 to connect the flexible wiring circuit substrate, which supplies powers or signals to the liquid crystal display device.

In the liquid crystal display device of FIG. 1, the TFT of the oxide semiconductor is used in the display area 500; the TFT of the poly silicon is used in the peripheral driving circuit 600. The TFT of the oxide semiconductor has a low leak current, thus, it is suitable for a switching element in the pixel. The TFT of the poly silicon has a high mobility, thus, it is suitable for a driving circuit. Such a structure is called a hybrid structure. The present invention, which is explained below, however, is also applicable to the structure that includes only the TFT of the oxide semiconductor or only the TFT of the poly silicon, not necessarily exclusive for the hybrid type.

Figure 2:
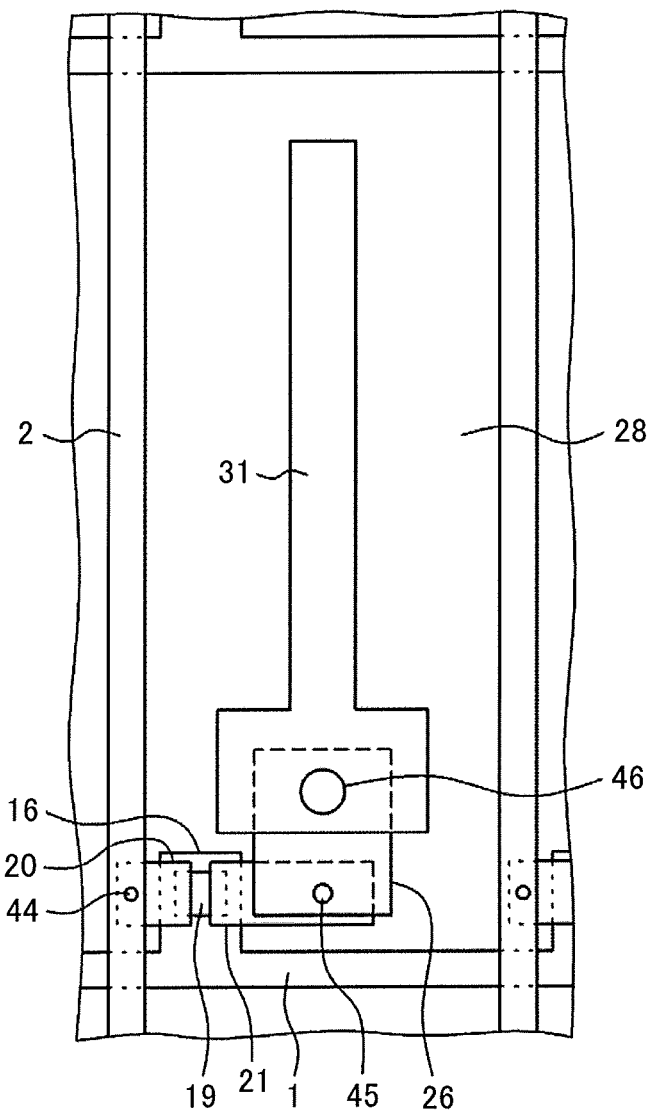
FIG. 2 is a plan view of the pixel area of the liquid crystal display device.

FIG. 2 is a plan view of the pixel in the display area 500 of the TFT substrate 10. In FIG. 2, the scanning lines 1 extend in the lateral direction (x direction) and are arranged in the longitudinal direction (y direction). The video signal lines 2 extend in the longitudinal direction (y direction) and are arranged in the lateral direction (x direction). The pixel electrode 31 and the TFT are formed in the area surrounded by the scanning lines 1 and the video signal lines 2. The TFT in FIG. 2 is a bottom gate type.

In FIG. 2, the active element (the semiconductor layer) of the TFT is formed by oxide semiconductor layer 19. The TFT of the oxide semiconductor layer 19 can make the leak current low. By the way, the oxide semiconductors that are optically transparent and amorphous are called TAOS (Transparent Amorphous Oxide Semiconductor). The examples of TAOS are IGZO (Indium Gallium Zinc Oxide), ITZO (Indium Tin Zinc Oxide), ZnON (Zinc Oxide Nitride), IGO (Indium Gallium Oxide), and so on. In the present invention, the IGZO is used for the oxide semiconductor layer 19.

In FIG. 2, the oxide semiconductor layer 19 is formed over the gate electrode 16 via the gate insulating film. The drain electrode 20 and the source electrode 21 are disposed on the oxide semiconductor layer 19, the channel is formed between the drain electrode 20 and the source electrode 21. The drain electrode 20 connects with the video signal line 2 via through hole 44; the source electrode 21 connects with the contact electrode 26 via through hole 45. The contact electrode 26 connects with the pixel electrode 31 via through hole 46.

The pixel electrode 31 is stripe shaped. The common electrode 28 is formed in a planar shape under the pixel electrode 31 via the capacitive insulating film. The common electrode 28 is formed on all over the surface except the through hole 46. When the video signal is applied to the pixel electrode 31, the line of force penetrating the liquid crystal layer is generated between the common electrode 28 and the pixel electrode 31 to rotate the liquid crystal molecules, thus, the transmittance is controlled in each of the pixels.

In FIG. 2, the pixel electrode 31 is formed by one stripe because the width of the pixel in the lateral direction is as small as 30 μm. However, if the lateral width of the pixel becomes bigger, the pixel electrode 31 can be e.g. a comb shaped electrode having a slit inside. FIG. 2 is so called an IPS (In Plane Switching) type liquid crystal display device.

Figure 3:
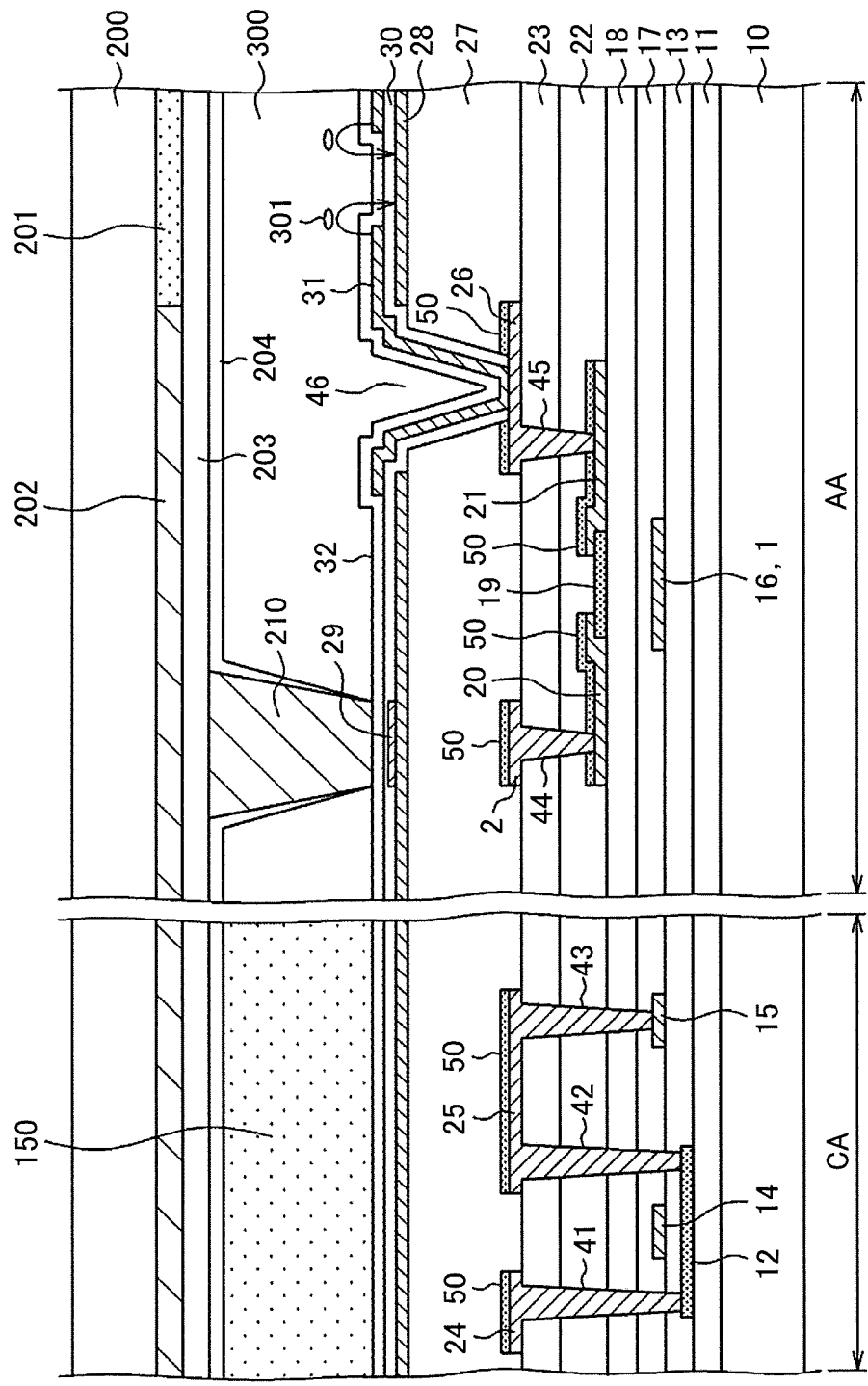
FIG. 3 is a cross sectional view of the liquid crystal display device.

FIG. 3 is a cross sectional view of the display area 500 and the peripheral driving circuit 600 of FIG. 1. In FIG. 3, the left hand side indicated by CA is the peripheral driving circuit; the area indicated by AA is the display area. In FIG. 3, the undercoat 11 is formed on the TFT substrate 10, which is formed by glass and the like. If the liquid crystal display device is intended to be a flexible display device, the TFT substrate 10 is formed by resin as e.g. polyimide. In many cases, the undercoat 11 is made of a laminated film of the SiN film and the SiO film. The laminated film can be a two layer structure of the silicon oxide film (herein after SiO film) and the silicon nitride film (herein after SiN film). The role of the undercoat 11 is to prevent the semiconductor layer 19 from being contaminated by impurities from the TFT substrate 10 made of glass or the like.

In FIG. 3, in the peripheral driving circuit area CA, the poly silicon layer 12 is formed on the undercoat 11. A thickness of the poly silicon layer 12 is e.g. 50 nm. The poly silicon layer 12 is formed as that: the a-Si (amorphous-Si) layer is formed by CVD at first, then, the a-Si layer is transformed to the poly silicon layer by irradiating excimer laser, after that the poly silicon layer is patterned. Such a poly silicon layer is called LTPS (Low Temperature Poly Silicon). The a-Si layer is continuously formed by CVD after the SiO layer and the SiN layer that constitute the undercoat 11 have been formed in the same CVD chamber.

The first gate insulating film 13 is formed by SiO covering the poly silicon layer 12. The first gate insulating film 13 is a SiO film that is formed by CVD with using TEOS (Tetraethyl orthosilicate) as the material. The first gate electrode 14 is formed on the first gate insulating film 13. The wiring 15 for the peripheral driving circuit is formed by the same material and on the same layer as the first gate electrode 14.

In the display area AA, at the same time, the second gate electrode 16 is formed for the switching TFT in the pixel. The second gate electrode 16 is a branch of the scanning line 1. By the way, the TFT of poly silicon 12 in the peripheral driving circuit CA is a top gate type while the TFT of the oxide semiconductor 19 in the display area AA is a bottom gate type. The gate electrode 16 in the display area AA and the gate electrode 14 in the peripheral driving circuit CA are formed simultaneously. The second gate electrode 16 is formed by e.g. MoW; however, if the resistance of the scanning line 1 is required to be low, material that Al is sandwiched by Ti or by MoW is used.

The second gate insulating film 17 is formed covering the first gate electrode 14 and the second gate electrode 16, etc. The third gate insulating film 18 is formed on the second gate insulating film 17. The oxide semiconductor layer 19 is formed on the third gate insulating film 18 by sputtering. The IGZO is e.g. used as the oxide semiconductor layer 19. A thickness of the oxide semiconductor film 19 is e.g. 15 nm to 100 nm.

The second gate insulating film 17 is formed by e.g. SiN; the third gate insulating film 18 is formed by e.g. SiO. The resistance of the oxide semiconductor layer 19 is decreased when oxygens are extracted, thus, SiO is used for the third gate insulating film 18 so that oxygens are not extracted from the oxide semiconductor layer 19.

The drain electrode 20 is laminated on the oxide semiconductor layer 19 at one side; the source electrode 21 is laminated on the oxide semiconductor layer 19 at another side opposing to the drain electrode 20 with a certain distance. As will be explained later, the drain electrode 20 and the source electrode 21 are formed by three layer structure with an aluminum layer as a main layer. The channel is formed between the drain electrode 20 and the source electrode 21.

The feature of the present invention is, as explained later, that the second oxide semiconductor layer 50 is formed on the drain electrode 20 and on the source electrode 21 as a protective layer. In this specification, the oxide semiconductor layer 50 for the protective layer is called the second oxide semiconductor layer. A thickness of the second oxide semiconductor layer 50 is between 3 nm to 10 nm.

The first passivation film 22 is formed by SiO covering the drain electrode 20 and the source electrode 21. The second passivation film 23 is formed by SiN on the first passivation film 22. Since the first passivation film 22 contacts with the oxide semiconductor layer 19, it is an oxygen rich film so that the first passivation film 22 does not extract oxygens from the oxide semiconductor film 19. The second passivation film 23, which is formed by SiN, blocks the moisture that comes from the upper layers.

After the second passivation film 23 is formed, in the peripheral driving circuit CA, the through hole 41 is formed to connect the LTPS 12 and the drain wiring 24; the through hole 42 is formed to connect the LTPS 12 and the source wiring 25; and the through hole 43 is formed to connect the circuit wiring 15 and the source wiring 25. In the display area AA, the through hole 44 is formed to connect the video signal line 2 and the drain electrode 20, and the through hole 45 is formed to connect the contact electrode 26 and the source electrode 21.

The organic passivation film 27 is formed covering the video signal line 2 and the contact electrode 26 and the like. The organic passivation film 27 is formed by transparent resin like acrylic resin. Since the organic passivation film 27 has a role as a flattening film, it is made as thick as 2 μm to 4 μm.

The common electrode 28 is formed on the organic passivation film 27. The common electrode 28 is formed by a transparent conductive film as metal oxide film e.g. ITO (indium Tin Oxide); however, the metal oxide film has high resistance, therefore, common wiring 29 is formed to laminate with the common electrode 28, which is made of metal, to avoid voltage decrease in the common electrode 28.

The capacitive insulating film 30 is formed by SiN covering the common electrode 28. The pixel electrode 31 is formed by ITO on the capacitive insulating film 30. The plan view of the pixel electrode 31 is e.g. shown in FIG. 2. The pixel capacitance is formed between the pixel electrode 31 and the common electrode 28 sandwiching the capacitive insulating film 30.

The alignment film 32, which is for initial alignment of the liquid crystal, is formed covering the pixel electrode 31 and the capacitive insulating film 30. The alignment treatment for the alignment film 32 is executed by a rubbing process or a photo alignment process, which uses polarized ultra violet ray. The photo alignment process is advantageous in the IPS type liquid crystal display device. In FIG. 3, when the video signal is applied to the pixel electrode 31, the line of force as depicted by arrow is generated to rotate the liquid crystal molecules 301, thus, the light transmittance in each of the pixels is controlled.

In FIG. 3, the counter substrate 200 is disposed to sandwich the liquid crystal layer 300 between the TFT substrate 10. In general, the counter substrate 200 is formed by glass, however if the flexible display device is intended, the counter substrate 200 can be formed by resin, e.g. polyimide and the like. The color filter 401 and the black matrix 402 are formed inside of the counter substrate 200. The overcoat film 403 is formed covering the color filter 401 and the black matrix 402. The alignment film 404 is formed on the overcoat film 403. Alignment treatment for the alignment film 404 is the same as the alignment film 32 of the TFT substrate 10.

In FIG. 3, the columnar spacer 210 is formed on the overcoat film 403 of the counter substrate 200 to maintain a distance between the TFT substrate 10 and the counter substrate 200, in other words, to maintain a thickness of the liquid crystal layer 300 constant. By the way, sometimes, the peripheral driving circuit CA is formed under the sealing material 150 in a plan view. FIG. 3 is the example in the peripheral driving circuit area CA that the sealing material 150 is formed at the position corresponding to the liquid crystal layer 300 in the display area AA.

Figure 4:
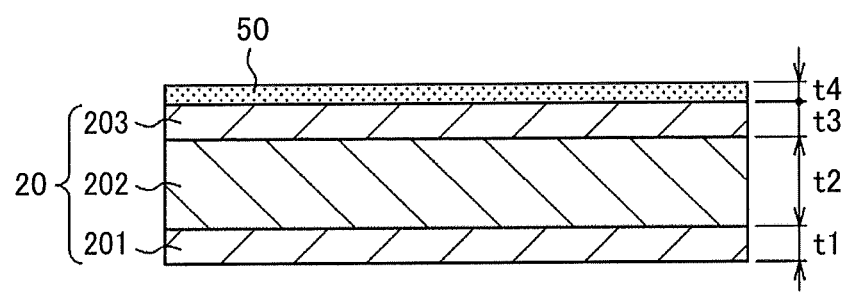
FIG. 4 is a cross sectional view of the drain electrode and the like according to the present invention.

FIG. 4 is an example of a cross sectional view of the drain electrode 20 in the display area AA. The aluminum layer 202 is used in the drain electrode 20 to decrease the resistance; the aluminum, however, is easily oxidized or tends to generate the hillocks, thus, it is sandwiched by the base metal 201 and the cap metal 203. The base metal 201 and the cap metal 203 are formed by e.g. titanium (Ti). By the way, when it is said aluminum in this specification, it does not necessarily mean the pure aluminum, but means the aluminum alloy in that the aluminum is a main substance. In many cases the aluminum layer 202 is made of aluminum alloy of AlSi or AlCu, or the like.

In FIG. 4, the second oxide semiconductor film 50 is formed as the protective layer on the cap metal 203. The role of the second semiconductor layer 50 is to prevent the cap metal 203 from being oxidized and to prevent the cap metal 203 and the aluminum layer 202 from being dissolved at the through hole when the through hole is formed. In FIG. 4, a thickness of base metal 201 is 50 nm, a thickness of the aluminum layer 202 is 300 nm and a thickness of the cap meal 203 is 50 nm. The thickness of the second semiconductor layer 50 is 3 nm to 10 nm. The second oxide semiconductor can have the effect of the present invention even it is made thin.

Figure 5:
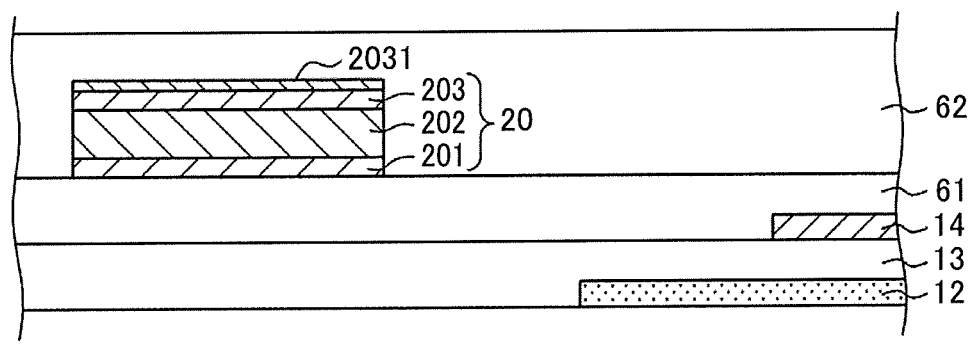
FIG. 5 is a cross sectional view of the drain electrode and the like that shows a problem when the present invention is not used.
Figure 6:
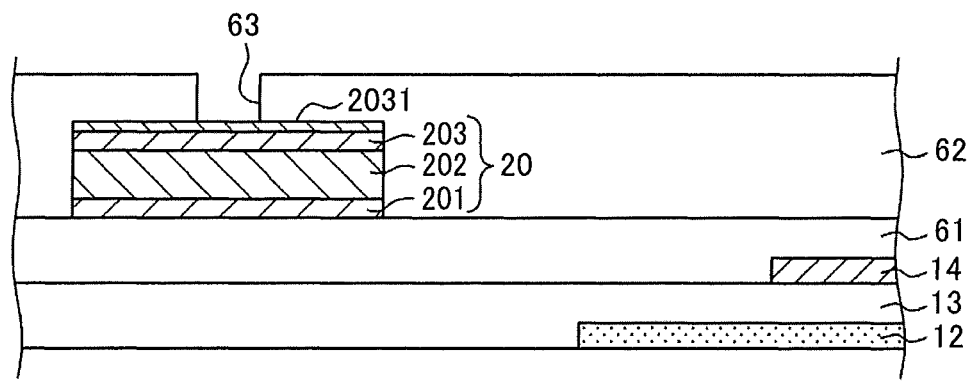
FIG. 6 is another cross sectional view of the drain electrode and the like that shows a problem when the present invention is not used.

FIG. 5 and FIG. 6 are figures to explain the first problem when the present invention is not used. In FIG. 5, the gate insulating film 13 is formed on the poly silicon semiconductor layer 12; the gate electrode 14 is formed on the gate insulating film 13; the first interlayer insulating film 61 is formed on the gate electrode 14; and the drain electrode 20 is formed on the first interlayer insulating film 61. The present invention is not limited to the drain electrode 20, however, the present invention is applicable to the similar structures of other electrodes or wirings. The drain electrode 20 is chosen only for the explanation.

The second interlayer insulating film 62 is formed covering the drain electrode 20. When the oxide semiconductor layer 19 is formed on the second interlayer insulating film 62, the second interlayer insulating film 62 is formed to be an oxygen rich film. Consequently, the surface of the cap metal 203 of the drain electrode 20 is oxidized; and eventually the oxide film 2031 is formed.

FIG. 6 is a cross sectional view that the through hole 63 is formed in the second interlayer insulating film 62 under this circumstance. For example, when the cap metal 203 is formed by titanium, the titanium oxide film 2031 is formed on the surface. Since the titanium oxide film 2031 is an insulating film, an electrical connection is not made even the through hole 63 is formed.

Figure 7:
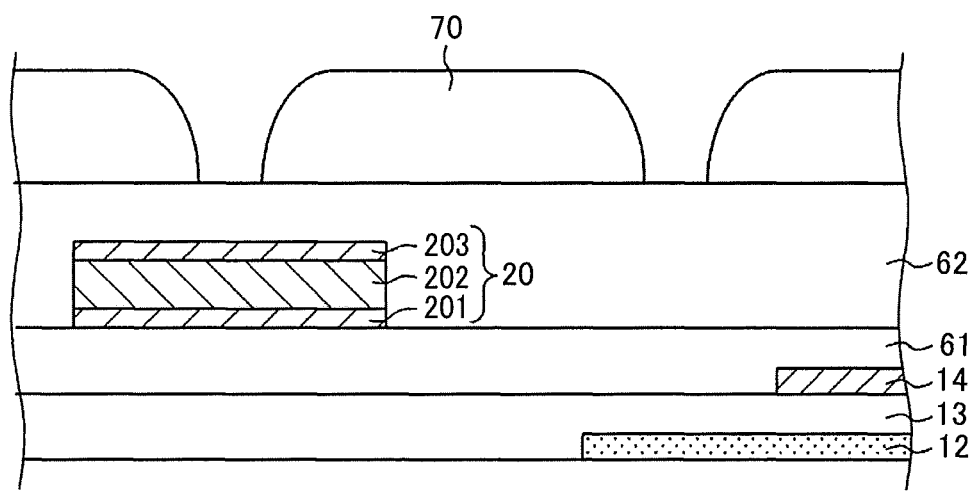
FIG. 7 is a cross sectional view of the drain electrode and the like that shows another problem when the present invention is not used.
Figure 8:
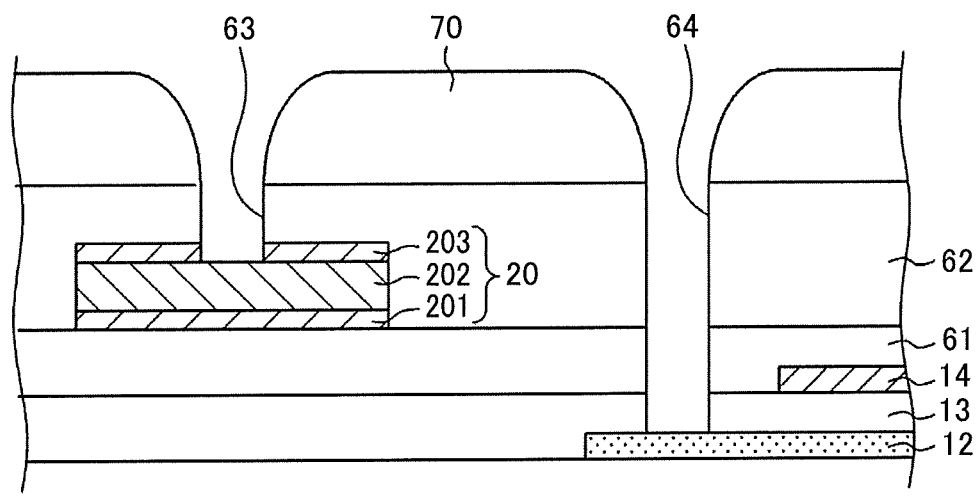
FIG. 8 is another cross sectional view of the drain electrode and the like that shows another problem when the present invention is not used.
Figure 9:
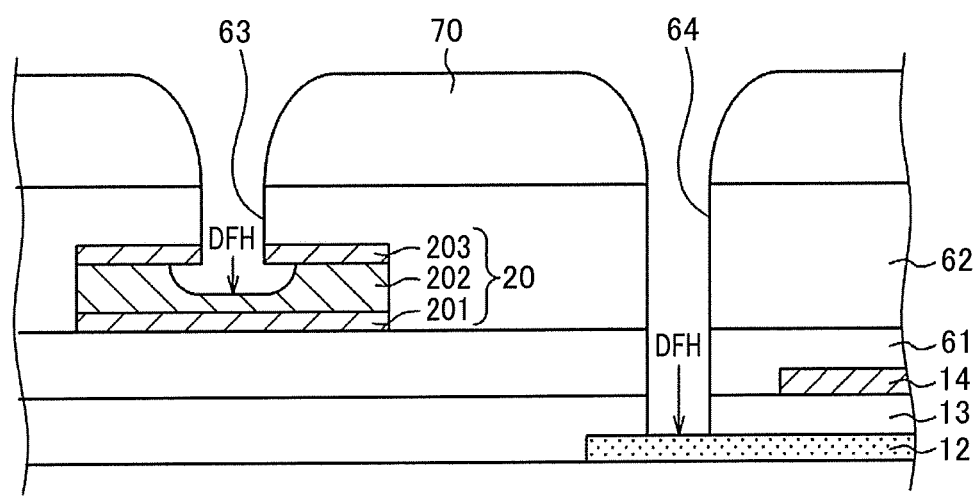
FIG. 9 is yet another cross sectional view of the drain electrode and the like that shows another problem when the present invention is not used.

FIG. 7 through FIG. 9 are cross sectional views that explain another problem when the present invention is not used. FIG. 7 is a cross sectional view that the photo-resist 70 is patterned on the second interlayer insulating film 62 to form the through holes. In this state, the dry etching is applied to etch the second interlayer insulating film 62 formed by SiO.

The SiO layer 62 can be dry etched under the mixture gasses of fluoride based gas of e.g. sulfur hexafluoride (SF6) and Ar. FIG. 8 is a cross sectional view that through holes 63 and 64 are formed by dry etching under the fluoride based gasses. The fluoride base gasses can etch titanium, too. Thus, aluminum layer 202 is exposed at the through hole 63 of the drain electrode 20.

By the way, in the through hole 64 formed on the poly silicon layer 12, an electrical connection cannot be taken if the oxide film, which is formed on the poly silicon layer 12 during the dry etching, is not removed. Therefore, as depicted in FIG. 9, the through hole 64 must be washed with the diluted hydro fluoride (DHF) to remove the oxide film. The diluted hydro fluoride (DHF), however, dissolves the aluminum layer 202; thus, there occurs danger that the aluminum layer 202 disappear in the through hole 63 at the drain electrode 20. Consequently, the connection at the through hole 63 becomes unstable.

The present invention solves the above explained problem by forming the second oxide semiconductor layer 50 on the cap metal 203. FIG. 10 through FIG. 19 are cross sectional views of processes that realize the structure of the present invention. FIG. 10 through FIG. 19 also explain taking an example of the drain electrode 20; however, the present invention is applicable not only to the drain electrode 20 but also to the electrodes or wirings having similar cross sectional structures.

Figure 10:
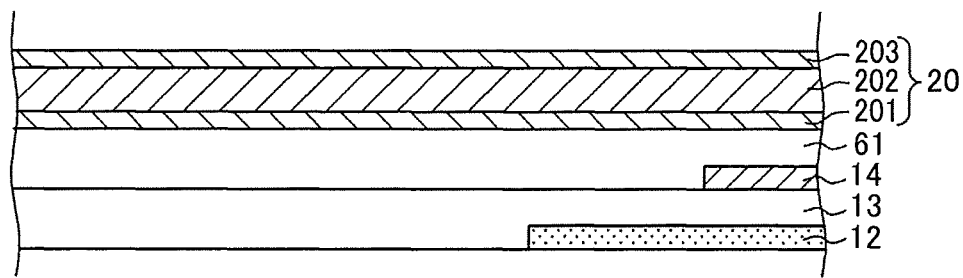
FIG. 10 is a cross sectional view of the structure in a first process to realize the structure of the present invention wherein the drain electrode is deposited on the first interlayer insulating film.

FIG. 10 is a cross sectional view that the layer for the drain electrode 20 are deposited on the first interlayer insulating film 61, which is formed over the poly silicon layer 12, the gate insulating film 13 and the gate electrode 14. The base metal 201, the aluminum layer 202 and the cap metal 203 are formed in this order on the first interlayer insulating film 61. The structure of the drain electrode 20 is the same as explained in FIG. 4.

Figure 11:
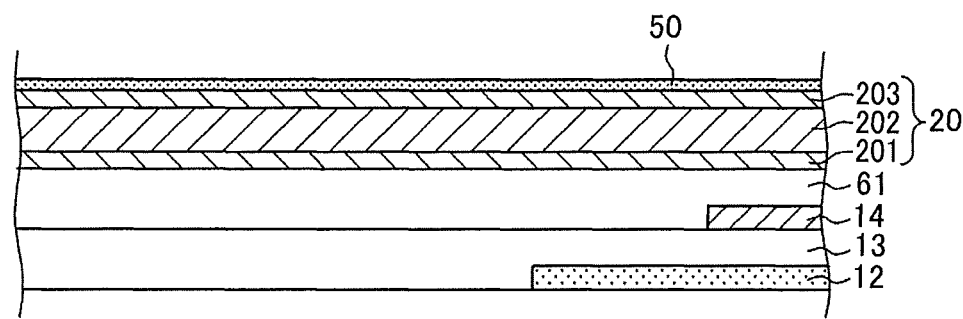
FIG. 11 is a cross sectional view that the oxide semiconductor film as the protective layer is formed on the drain electrode.

FIG. 11 is a cross sectional view that the second oxide semiconductor layer 50 as the protective layer is formed on the cap metal 203 by sputtering. The thickness of the second oxide semiconductor film 50 is 3 nm to 10 nm. The IGZO is used for the second oxide semiconductor 50, for example.

Figure 12:
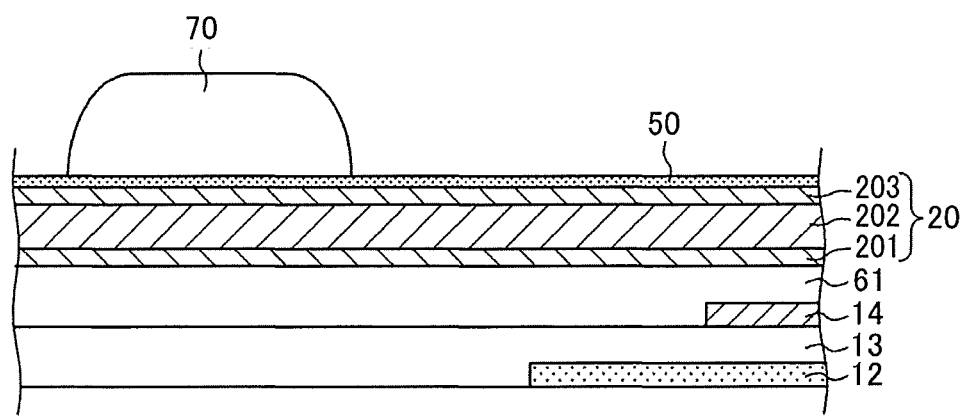
FIG. 12 is a cross sectional view that the photo resist is patterned for the patterning of the drain electrode.

FIG. 12 is a cross sectional view that the photo-resist 70 is patterned for patterning of the drain electrode 20. In this state, the dry etching is executed under the chloride based gases. The chloride based gasses are mixture of chloride ($Cl_2$) and boron trichloride ($BCl_3$). The chloride base gas can dry etch the oxide semiconductor 50 as well as the titanium and aluminum; thus, the process burden does not increase.

Figure 13:
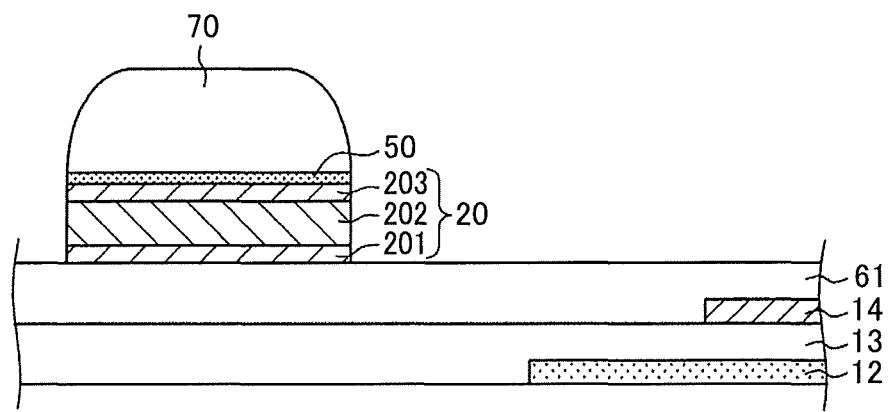
FIG. 13 is a cross sectional view that the drain electrode is patterned.
Figure 14:
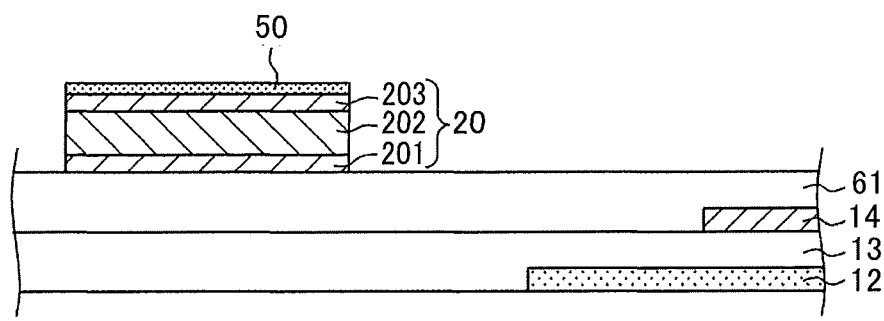
FIG. 14 is a cross sectional view that the photo resist is stripped off from the drain electrode.

FIG. 13 is a cross sectional view that the drain electrode 20 is patterned through the dry etching. After that, as depicted in FIG. 14, the photo resist 70 is removed by the resist stripping solution.

Figure 15:
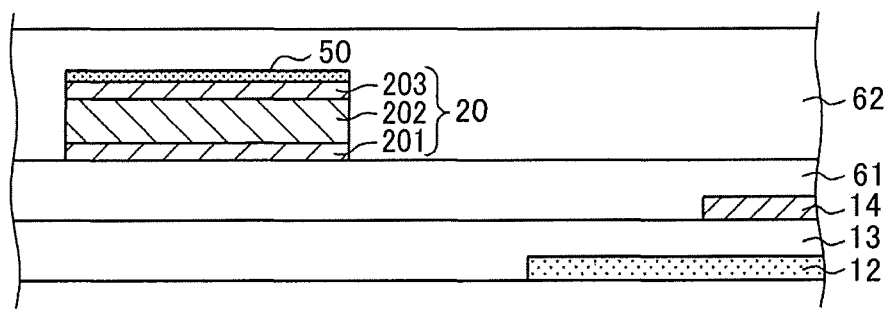
FIG. 15 is a cross sectional view that the second interlayer insulating film is formed.

FIG. 15 is a cross sectional view that the second interlayer insulating film 62 is formed to cover the drain electrode 20. The second interlayer insulating film 62 is formed by e.g. SiO film. Even the second interlayer insulating film 62 is an oxygen rich film, the surface of the cap metal 203 is not oxidized because the surface of the cap metal 203 is covered by the oxide semiconductor layer 50.

Figure 16:
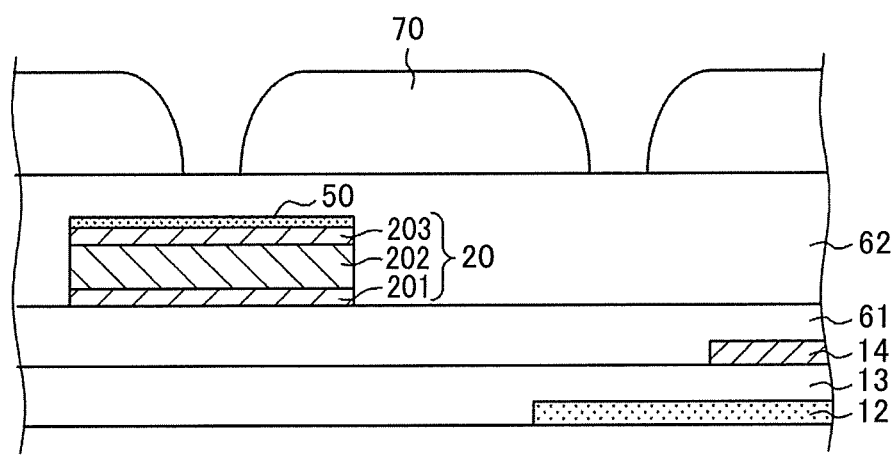
FIG. 16 is a cross sectional view that the photo resist is patterned for the through hole.
Figure 17:
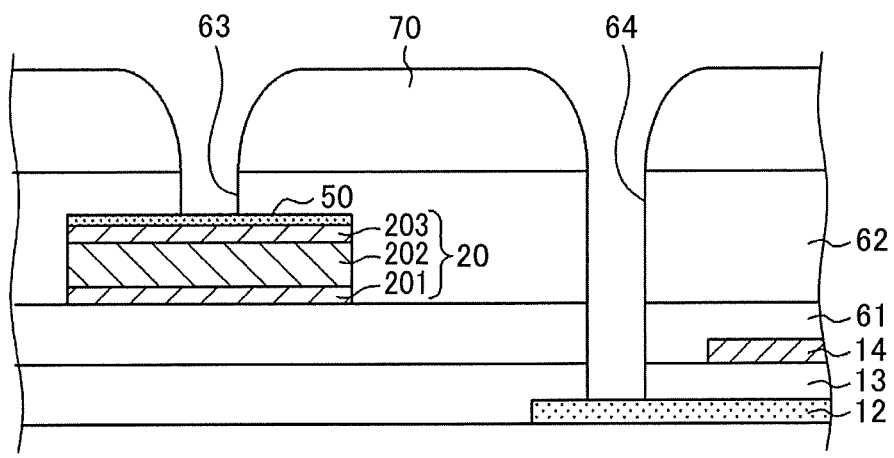
FIG. 17 is a cross sectional view that the through hole is formed.

FIG. 16 is a cross sectional view that the photo resist 70 is coated and patterned on the second interlayer insulating film 62 for forming through holes in the second interlayer insulating film 62 and the first interlayer insulating film 61. FIG. 17 is a cross sectional view that through holes 63 and 64 are formed through dry etching. The dry etching is executed under the fluoride based gasses, namely, mixture of fluoride based gas of e.g. sulfur hexafluoride (SF6) and Ar.

As depicted in FIG. 17, the through hole 63 for the drain electrode 20 is formed only in the second interlayer insulating film 62; however, the through hole 64 for the poly silicon layer 12 is formed through three layers of the second interlayer insulating film 62, the first interlayer insulating film 61 and the gate insulating film 13. Therefore, the drain electrode 20 is exposed to the dry etching for a longer time. If there were no second oxide semiconductor 50, the cap metal 203, which is made of titanium, disappear since the titanium is etched by the fluoride base gas.

In FIG. 17, however, the drain electrode 20 is covered by the second oxide semiconductor layer 50, which is not etched by the fluoride base gasses, thus, titanium, which constitutes the cap metal 203 does not disappear. In other words, the second oxide semiconductor layer 50 has a role as an etching stopper.

Figure 18:
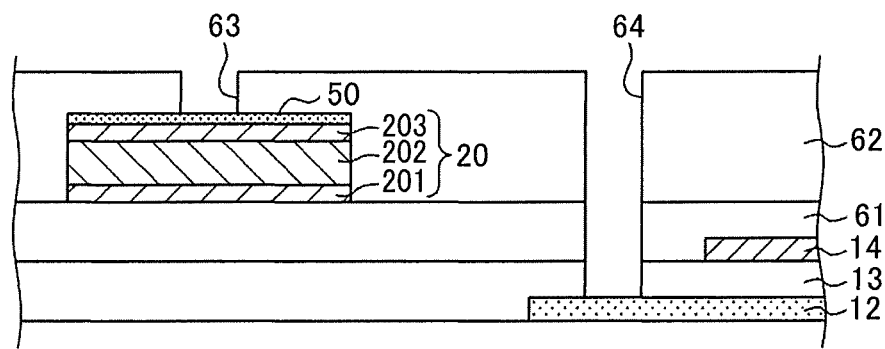
FIG. 18 is a cross sectional view that the photo resist is stripped off from the surface of the second interlayer insulating film.
Figure 19:
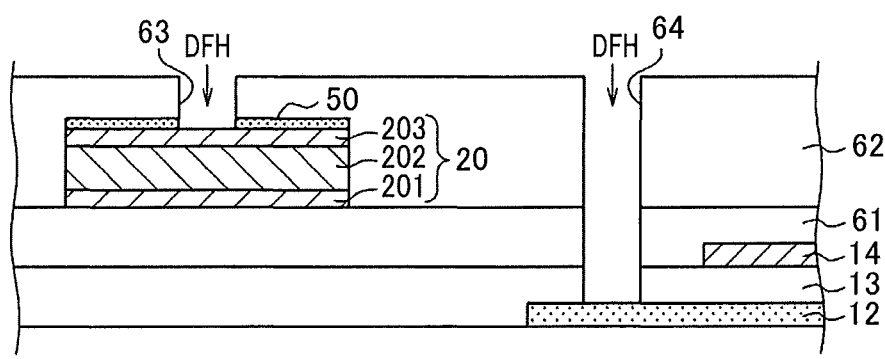
FIG. 19 is a cross sectional view that the through holes are being washed with the diluted hydro fluoride (DHF)

FIG. 18 is a cross sectional view that the photo-resist 70 is stripped off after the dry etching. FIG. 19 is a cross sectional view that the through hole 64 at the poly silicon layer 12 is being washed by diluted hydro fluoride (DHF) to remove the oxide layer on the surface of the poly silicon layer 12 after the through holes 63 and 64 are formed. This diluted hydro fluoride (DHF) washes the through hole 63 at the drain electrode 20, too.

The second oxide semiconductor layer 50 can be removed by the diluted hydro fluoride (DHF). However, the cap metal 203, which is formed by titanium, is not etched by the diluted hydro fluoride (DHF); thus, aluminum layer 202 is not dissolved by the diluted hydro fluoride (DHF). As describe above, after the washing by the diluted hydro fluoride (DHF), the fresh titanium film 203 is exposed in the through hole 63, thus, good contact can be taken.

By the way, in the processes of FIG. 17 to FIG. 18, if the resist stripping solution, which removes the photo resist 70, also removes the second oxide semiconductor 50 at the same time, the second oxide semiconductor layer 50 in the through hole 63 is to have been removed before the diluted hydro fluoride (DHF) is applied; however, the effect of the present invention is the same.

The above explanation was made for the drain electrode 20, however, the processes are the same for the source electrode 21 as depicted in FIG. 3.

Embodiment 2

Figure 20:
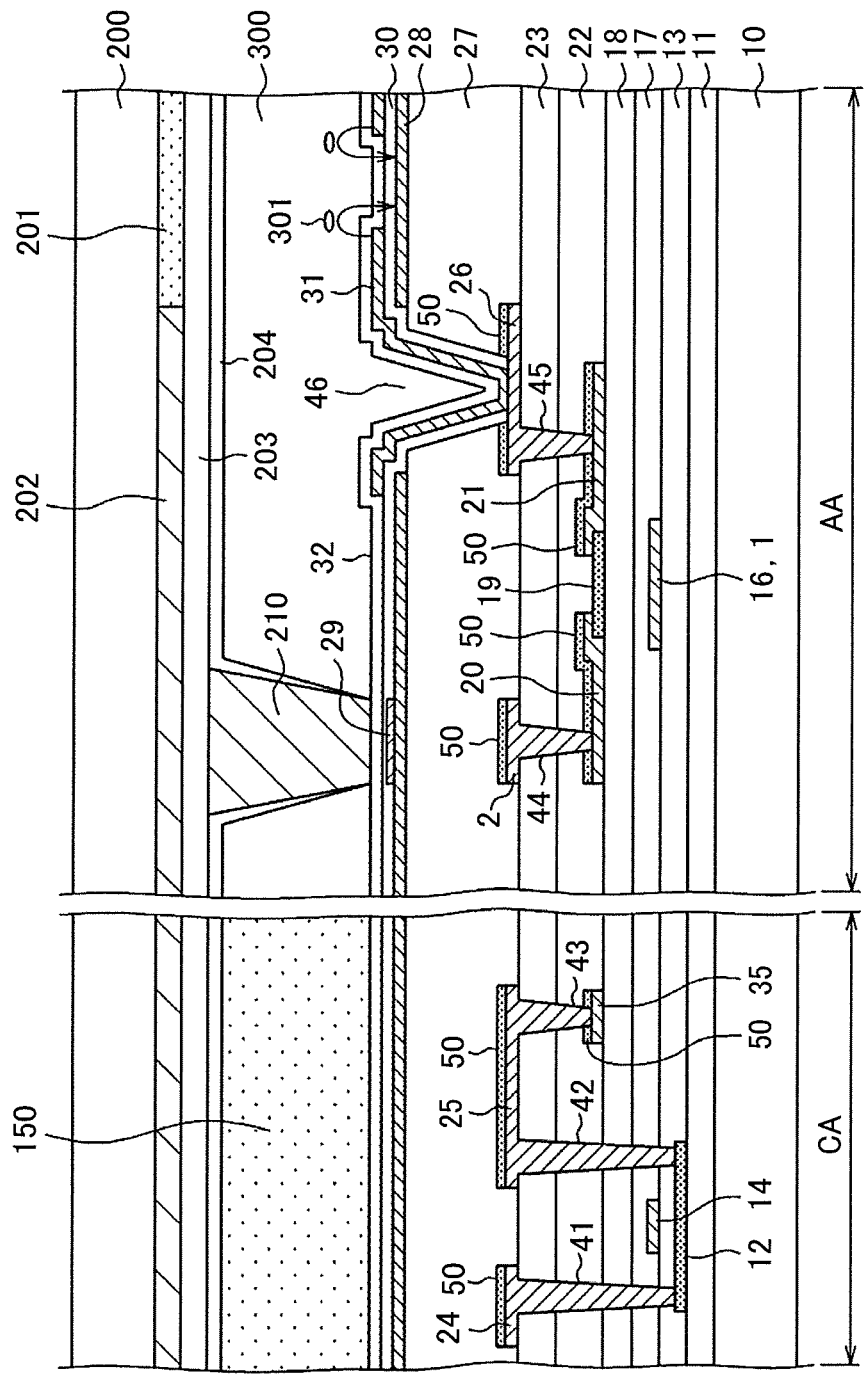
FIG. 20 is a cross sectional view of the liquid crystal display device according to the embodiment 2 of the present invention.

FIG. 20 is a cross sectional view of the embodiment 2 according to the present invention. FIG. 20 differs from FIG. 3 of the embodiment 1 in that the circuit wiring 35 in the peripheral driving circuit CA is formed on the same layer as the drain electrode 20 and the source electrode 21 in the display area AA not on the same layer as the first gate electrode 14; and further, the structure of the circuit wiring 35 have a three layer structure as the same as the drain electrode 20 and the source electrode 21.

In FIG. 20, the circuit wiring 35 connects with the source wiring 25 via through hole 43. The connection structure is the same as the connection structure between the drain electrode 20 and the video signal line 2 explained before. Namely, the present invention explained at FIG. 10 through FIG. 19 is applicable to the peripheral driving circuit CA as the same manner.

Embodiment 3

Figure 21:
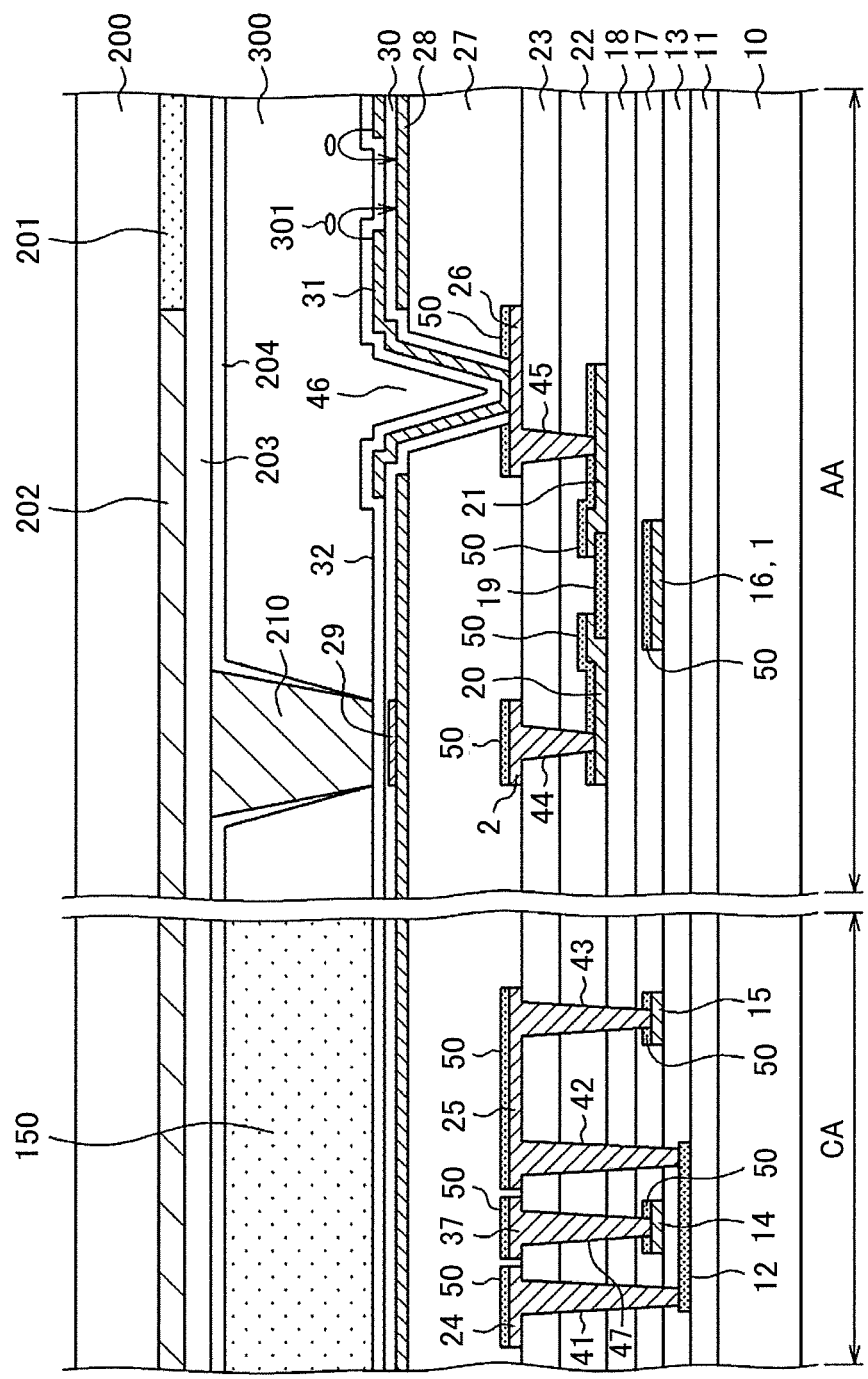
FIG. 21 is a cross sectional view of the liquid crystal display device according to the embodiment 3 of the present invention.

FIG. 21 is a cross sectional view of the embodiment 3 according to the present invention. FIG. 21 differs from FIG. 3 of the embodiment 1 in that the first gate electrode 14, the second gate electrode 16 and the circuit wiring 15 are not a single layer, but they are formed by three layers as depicted in FIG. 4, which was explained for the drain electrode 20 and the source electrode 21 in the embodiment 1. The three layers in this case can be the structure that the aluminum layer 202 is sandwiched by titanium layers 201 and 203 as the drain electrode 20 and the like, or can be the structure that the aluminum layer is sandwiched by MoW alloy layers.

The structure of through hole 43 formed at the circuit wiring 15 in the peripheral driving circuit CA in FIG. 21 is the same as the through hole 44 at the drain electrode 20 in the display area AA. The gate electrode 14 of the TFT formed in the peripheral driving circuit CA is a three layer structure; and is connected to the gate wiring 37, which is formed on the same layer as the video signal line 2 and the like, via the through hole 47. This connection structure, too, is the same as the through hole 44 at the drain electrode 20 and the like in the display area AA, which is explained in the embodiment 1.

Further, the gate electrode 16 of the TFT in the display area AA has a three layer structure as the drain electrode 20 and so on. The gate electrode 16 and the scanning line 1 of the TFT in the display area AA connects with the wiring that is formed on the same layer as the drain electrode 20 or the video signal line 2 via a through hole at a cross section that is not shown in FIG. 21. This through hole can have the same structure as the through hole 44 for the connection of the drain electrode 20 and the like as explained in the embodiment 1.

The present invention explained in the embodiment 1 through embodiment 3, as explained in FIG. 11, differs from the conventional structure only in that the second oxide semiconductor layer 50 is formed on the drain electrode 20 and the like in the thicknesses of the 3 nm to 10 nm by e.g. sputtering, and other processes are the same as the conventional process. In addition, sputtering can be executed for only a short time continuously after the drain electrode 20 and the like have been formed by sputtering. Thus, big effect can be enjoyed without increasing a substantial process burden.

As described above, according to the present invention, the oxidization of the surface of the drain electrode and the like can be avoided; and the erosion of the metal or dissolution of the metal when the through hole is formed can be avoided. Therefore, the display device of high reliability can be realized.

The TFT having the oxide semiconductor layer in FIGS. 3 and 20 are bottom gate type; however, there are TFTs having the oxide semiconductor layer of top gate type or dual gate type, which the gate electrodes exist at the upper and the lower sides of the oxide semiconductor layer. The present invention is applicable to those cases as the same manner. Furthermore, the TFT having the poly silicon layer in FIGS. 3 and 20 are top gate type; however, there are TFTs having the poly silicon layer of bottom gate type or dual gate type, which the gate electrodes exist at the upper and the lower sides of the poly silicon layer. The present invention is applicable to those cases as the same manner.

The above explanation is made for the IPS type liquid crystal display device; however, the present invention is applicable to other types of the liquid crystal display devices. Furthermore, the organic EL display device is the same as the liquid crystal display device in that it has the switching TFTs and the TFTs in the peripheral driving circuit. Further, the cross sectional structure in the display area is basically the same up to the formation of the organic passivation film. Therefore, the structure of the present invention explained above can be applied to the organic EL display device.

What is claimed is:

1. A display device having a display area including a plurality of pixels comprising:
    the pixel includes a thin film transistor having a semiconductor layer as an active element,
    a first insulating film is formed to cover a drain electrode of the thin film transistor,
    the drain electrode is connected with an electrode or an wiring that are formed on the first insulating film via a through hole,
    an oxide semiconductor layer exists between the drain electrode and the first insulating film,
    the oxide semiconductor layer does not exist at the bottom of the through hole,
    wherein a thickness of the oxide semiconductor layer between the drain electrode and the first insulating film is smaller than a thickness of the oxide semiconductor layer as the active element.

2. The display device according to claim 1,
    wherein a thickness of the oxide semiconductor film is between 3 nm and 10 nm.

3. The display device according to claim 1,
    wherein the oxide semiconductor film is formed by IGZO.

4. The display device according to claim 1,
    wherein the drain electrode is a structure that an aluminum layer whose main substance is aluminum is sandwiched by a base metal and a cap metal.

5. The display device according to claim 4,
    wherein the base metal and the cap metal are formed by titanium.

6. The display device according to claim 1,
    wherein the first insulating film is formed by SiO.

7. The display device according to claim 1,
    wherein the first insulating film is a structure that a SiO film is laminated by a SiN film.

8. The display device according to claim 1,
    wherein the semiconductor layer as an active layer is an oxide semiconductor layer.

9. The display device according to claim 1,
    wherein the display device is a liquid crystal display device.

10. The display device according to claim 1,
    wherein the display device is an organic EL display device.

11. A display device having a display area and a peripheral driving circuit comprising:
    the peripheral driving circuit includes a plurality of thin film transistors, which include a plurality of semiconductors as active elements,
    a first insulating film is formed to cover a circuit wiring that connects the plurality of thin film transistors,
    the circuit wiring is connected with an electrode or a wiring that are formed on the first insulating film via a through hole,
    an oxide semiconductor layer exists between the circuit wiring and the first insulating film,
    the oxide semiconductor layer does not exist at the bottom of the through hole.

12. The display device according to claim 11,
    wherein a thickness of the oxide semiconductor film is between 3 nm and 10 nm.

13. The display device according to claim 11,
    wherein the oxide semiconductor film is formed by IGZO.

14. The display device according to claim 11,
    wherein the circuit wiring is a structure that an aluminum layer whose main substance is aluminum is sandwiched by a base metal and a cap metal.

15. The display device according to claim 14,
    wherein the base metal and the cap metal are formed by titanium.

16. The display device according to claim 11,
    wherein the first insulating film is formed by SiO.

17. The display device according to claim 11,
    wherein the semiconductor as the active element is a poly silicon layer.

18. A display device having a display area including a plurality of pixels comprising:
    the pixel includes a thin film transistor having a semiconductor layer as an active element,
    a first insulating film is formed to cover a gate electrode of the thin film transistor,
    the gate electrode is connected with an electrode or an wiring that are formed on the first insulating film via a through hole,
    an oxide semiconductor layer exists between the gate electrode and the first insulating film,
    the oxide semiconductor layer does not exist at the bottom of the through hole.

19. The display device according to claim 18,
    wherein a thickness of the oxide semiconductor film is between 3 nm and 10 nm.

* * * * *